(12) United States Patent
Wiedmann et al.

(10) Patent No.: US 7,983,315 B2
(45) Date of Patent: Jul. 19, 2011

(54) FREQUENCY CHANGING DEVICE

(75) Inventors: Joerg Wiedmann, Berlin (DE);
Friedemann Scholz, Berlin (DE)

(73) Assignee: Eagley Ard Photonics GmbH, Berlin (DE)

(*) Notice: Subject to any disclaimer, the term of this patent is extended or adjusted under 35 U.S.C. 154(b) by 126 days.

(21) Appl. No.: 12/354,156

(22) Filed: Jan. 15, 2009

(65) Prior Publication Data
US 2009/0180499 A1 Jul. 16, 2009

(30) Foreign Application Priority Data

Jan. 16, 2008 (DE) .................... 10 2008 005 114

(51) Int. Cl.
*H01S 3/10* (2006.01)
*G02F 1/35* (2006.01)

(52) U.S. Cl. ...................... 372/21; 372/22; 359/326

(58) Field of Classification Search .......... 372/21–22; 359/326
See application file for complete search history.

(56) References Cited

U.S. PATENT DOCUMENTS

| | | | | |
|---|---|---|---|---|
| 2002/0071470 A1* | 6/2002 | Goto | ............... | 372/92 |
| 2003/0123498 A1* | 7/2003 | Ishino | ............... | 372/21 |
| 2003/0189960 A1 | 10/2003 | Kitaoka et al. | | |
| 2004/0131093 A1* | 7/2004 | Waarts et al. | ............... | 372/22 |
| 2004/0136414 A1 | 7/2004 | Matsumoto et al. | | |
| 2005/0111512 A1 | 5/2005 | Krieg | | |
| 2006/0045147 A1* | 3/2006 | Sin et al. | ............... | 372/20 |
| 2007/0230519 A1* | 10/2007 | Heo et al. | ............... | 372/22 |

FOREIGN PATENT DOCUMENTS

| | | |
|---|---|---|
| DE | 699 09 713 T2 | 6/2004 |
| EP | 1 136 863 B1 | 5/2006 |
| GB | 2 419 033 A | 4/2006 |
| JP | 04-301625 A | 10/1992 |
| JP | 2001-242499 A | 9/2001 |
| JP | 2001-330744 A | 11/2001 |

OTHER PUBLICATIONS

Hong Ky Nguyen, et al "107-m Low-Noise Green-Light Emission by Frequency Doubling of a Reliable 1060-nm DFB Semiconductor Laser Diode" IEEE Photonics Technologies Letters, vol. 18, No. 5, Mar. 1, 2006.
Y. Kitaoka et al "Wavelength stabilization of a distributed Bragg reflector laser diode by use of complementary current injection" Optics Letters, vol. 28, No. 11, Jun. 1, 2003. W. P. Risk et al "Compact Blue-Green Lasers" 2003, chapters 6.3 and 6.3.1.
Kiminori Mizuuchi et al "Efficient 340-nm light generation by a ridge-type waveguide in a first-order periodically poled Mgo:LiNbO3" Optics Letters, vol. 28, No. 15, Aug. 1, 2003.
Brian R. Koch et al Monolithic Mode-Locked Laser and Optical Amplifier for Regenerative Pulsed Optical Clock Recovery: IEEE Photonics Technology Letters, vol. 19, No. 9, May 1, 2007.

* cited by examiner

*Primary Examiner* — Minsun Harvey
*Assistant Examiner* — Phillip Nguyen
(74) *Attorney, Agent, or Firm* — Maschoff Gilmore & Israelsen

(57) ABSTRACT

The invention relates to a frequency changing device comprising a laser having a waveguide and a nonlinear optical medium which changes the frequency of the light generated by the laser. It is provided that the waveguide of the laser at least adjacent to the exit facet of the laser runs at an angle with respect to the perpendicular to the exit facet, that the exit facet of the laser and the entrance facet of the nonlinear optical medium are arranged parallel to one another, and that the exit facet of the laser and the entrance facet of the nonlinear optical medium are oriented with respect to one another in such a way that the condition of Snell's law is met, i.e., $$n_{laser} \sin(\alpha_{laser}) = n_{nonlinear\ optical\ medium} \sin(\alpha_{nonlinear\ optical\ medium}).$$

28 Claims, 14 Drawing Sheets

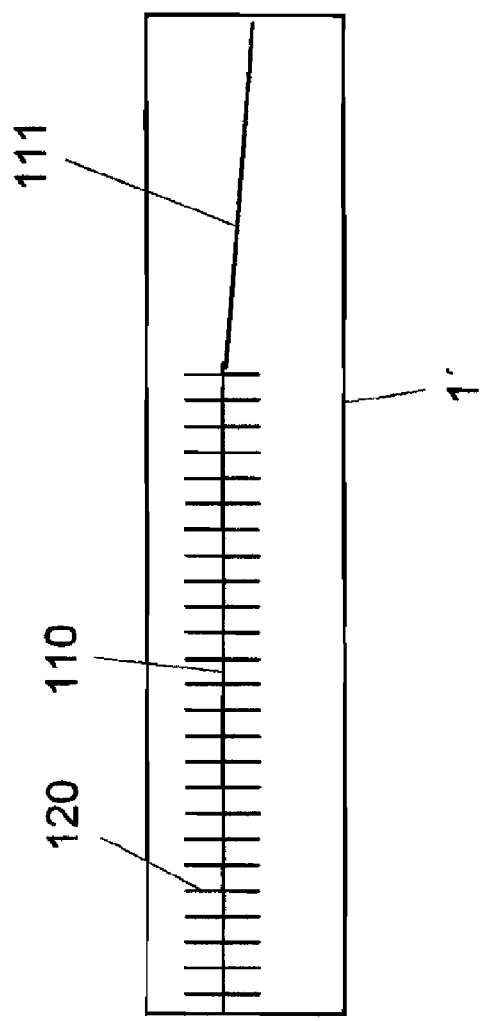
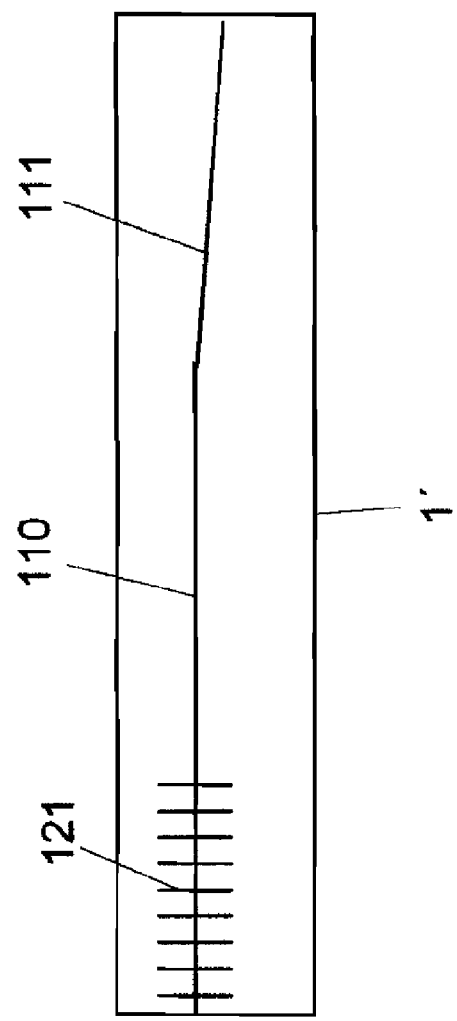

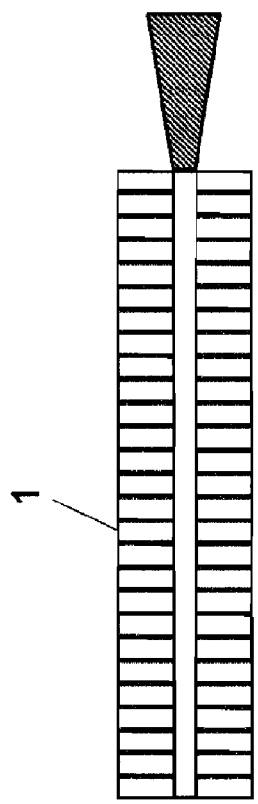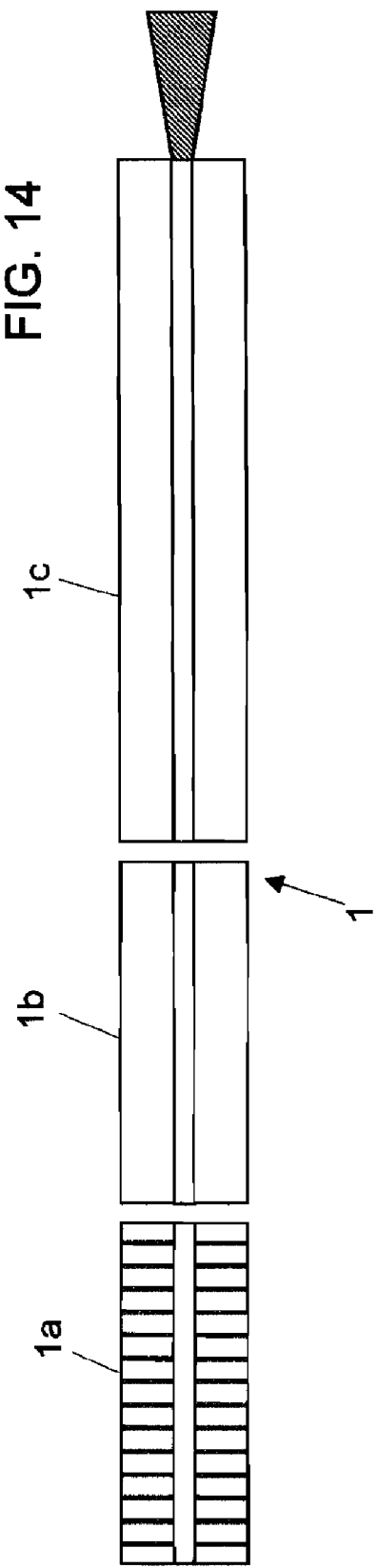

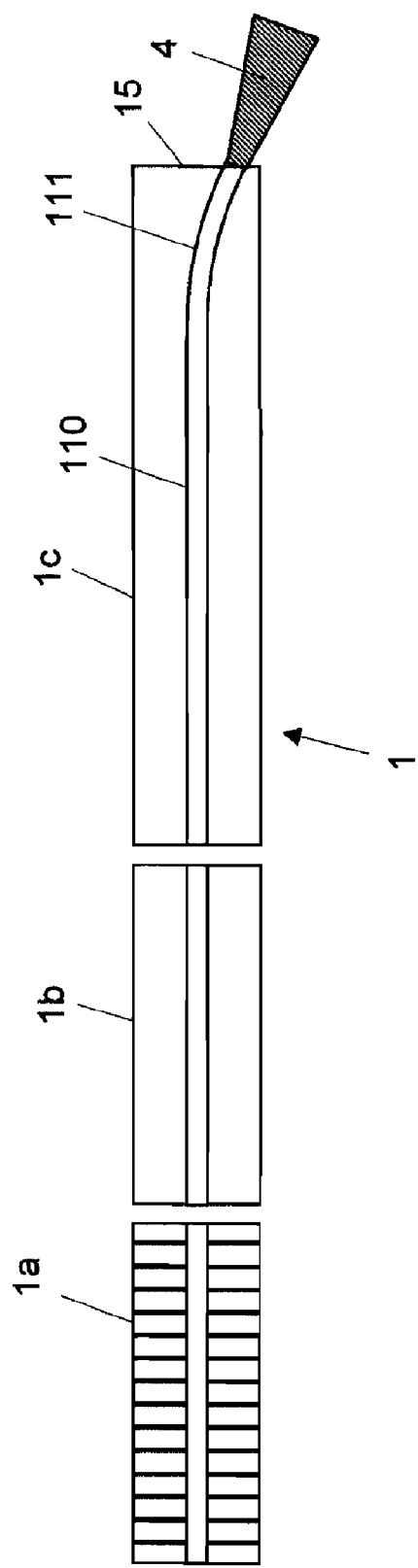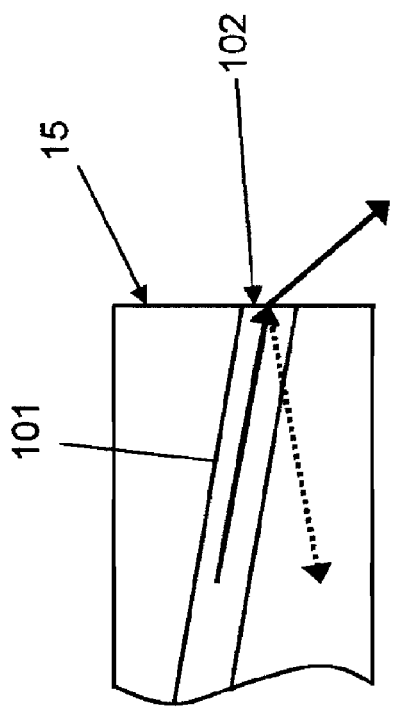

FREQUENCY CHANGING DEVICE

CROSS-REFERENCE TO A RELATED APPLICATION

This application claims priority of German Patent Application No. 10 2008 005 114.4 filed on Jan. 16, 2008.

BACKGROUND

The invention relates to a frequency changing device.

It is known to double the frequency of the light generated by a laser by means of a nonlinear optical medium, which is a crystal, for example. For effective frequency doubling it is necessary for light emerging from the laser to be coupled into the nonlinear optical medium with high efficiency. For this purpose, it is known for example from H. K. Nguyen et al.: 107-mW Low-Noise Green-Light Emission by Frequency Doubling of a Reliable 1060-nm DFB Semiconductor Laser Diode, IEEE Photonics Technologies Letters, Vol. 18, no. 5, Mar. 1, 2006 to use a lens system for coupling the laser and the crystal, which lens system images the light coupled out from the laser onto a small region of the entrance facet of the crystal.

Y. Kitaoka et al.: Wavelength Stabilization of a Distributed Bragg Reflector Laser Diode by Use of Complementary Current Injection, Optics Letters, Vol. 28, No. 11, Jun. 1, 2003, describes to couple the light from a laser embodied as a ridge waveguide laser directly, i.e. without a lens system, into a frequency-doubling crystal with integrated waveguide. A corresponding device is also described in W. P. Risk et al.: Compact Blue-Green Lasers, Cambridge University Press, 2003, chapters 6.3 and 6.3.1, which describe, inter alia, a butt coupling between a ridge waveguide laser diode and a frequency-doubling crystal with integrated waveguide.

The disadvantage of a butt coupling consists in undesired reflections at the exit facet of the laser and/or the entrance facet of the waveguide of the frequency-doubling crystal, which can lead to amplitude and/or frequency instabilities.

SUMMARY

The present invention is based on the object of providing a frequency changing device which enables light coupling between a laser and a nonlinear optical medium without the use of a lens system and at the same time with high coupling efficiency.

In an embodiment of the invention, in a laser, the waveguide of the laser, at least adjacent to the exit facet, is embodied at an angle with respect to the perpendicular to the exit facet. At the same time the exit facet of the laser and the entrance facet of the nonlinear optical medium are arranged parallel with respect to one another and in such a way that the condition of Snell's law is met. As the exit facet of the laser and the entrance facet of the nonlinear optical medium run parallel, a high coupling efficiency is achieved. At the same time, undesired back-reflections that can impair the performance of the laser are avoided or at least significantly reduced by means of the oblique arrangement of the waveguide relative to the exit facet.

On account of the parallelism and the meeting of the condition of Snell's law, the exit facet of the laser and the entrance facet of the nonlinear optical medium can be nestled as closely to one another as desired. It is possible to realize a butt coupling, i.e. the respective facets touch one another directly. A quasi-butt coupling is likewise possible, in which the facets are at a very small distance from one another, which is for example less than 20 µm or less than 10 µm. In the latter case it may be provided that the interspace between the facets is filled with an index-matched substance.

As a result of the parallelism of the facets and the compliance with the condition of Snell's law, the coupling efficiency of this tilted butt coupling is comparable with that of a straight butt coupling. As a result of the oblique arrangement of the laser waveguide at least adjacent to the exit facet of the laser, however, back-reflections are reduced despite the butt coupling and disturbance of the laser as a result of back-reflections is thus reduced or suppressed.

A back-reflection at the end side of a laser waveguide also has the disadvantage that the spectral behavior of the laser resonator is dependent on this back-reflection of the exit facet. In the solution according to an embodiment of the invention, by contrast, light reflected at the end side is not reflected back into the waveguide, but rather reflected out of the waveguide. Self-oscillations are thereby avoided. Moreover, the spectral behavior is stable and is not influenced, or is influenced only slightly, by the exit facet of the waveguide.

In accordance with the condition of Snell's law, there is always precisely one matching laser angle $\alpha_{laser}$ for any angles $\alpha_{nonlinear\ optical\ medium}$. Structurally, the procedure will involve predetermining a nonlinear optical medium with a facet having a specific bevel, for example a crystal with a specific angled polish. Provision is then made of a laser with an integrated waveguide which is at an angle $\alpha_{laser}$ with respect to the perpendicular to the exit facet of the laser in such a way that the condition of Snell's law is met after parallel arrangement of the facets.

In one embodiment of the invention, the nonlinear optical medium likewise has a waveguide, in which the light is guided in the nonlinear optical medium. In this case, the waveguide runs at the angle $\alpha_{nonlinear\ optical\ medium}$ with respect to the perpendicular to the entrance facet of the nonlinear optical medium, that is to say that the light coupled in from the laser is refracted in the direction of the waveguide and coupled into the latter. The waveguide of the nonlinear optical medium preferably runs parallel to the outer edges of the nonlinear optical medium.

It is provided in an embodiment that at least the entrance facet of the nonlinear optical medium is beveled relative to the propagation direction of the light in the nonlinear optical medium. In one configuration, both the entrance facet and the exit facet of the nonlinear medium are beveled at the same angle. It may be provided that the light passes through the crystal only once (so-called "single-pass").

In configurations of the invention, the laser is embodied as an index-guided laser or gain-guided laser. By way of example, the laser is embodied as a ridge waveguide laser. Furthermore, in one configuration, the laser is embodied as a laser chip having a rectangular base area that arises as a result of singulation of the lasers from a wafer during production. In this case, one side area of the laser chip forms the light exit facet of the laser. The waveguide, at least in a partial region which is adjacent to the exit facet, is embodied at an angle or in bent fashion with respect to the rectangular base structure in the laser diode.

According to an embodiment of the invention, the waveguide of the laser runs at an angle with respect to the perpendicular to the exit facet at least adjacent to the exit facet of the laser. This can be implemented in various ways. In one configuration, the waveguide of the laser is embodied at an angle with respect to the perpendicular to the exit facet of the laser over its entire length. In another configuration, the waveguide of the laser is embodied at an angle with respect to the perpendicular to the exit facet only in a region adjacent to the exit facet. It may furthermore be provided that the waveguide of the laser is embodied in a straight fashion or has regions embodied in a straight fashion, or that the waveguide of the laser is embodied in curved fashion at least adjacent to the exit area of the laser.

One configuration of the invention provides for the waveguide of the laser to have a changed cross section adjacent to the exit area of the laser. By way of example, the cross section can continuously taper or widen in a section of the waveguide toward the exit area. This can be utilized for additionally shaping the coupled-out field and thereby further improving the coupling efficiency into the nonlinear optical medium.

The laser can be embodied as a distributed feedback (DFB) laser, that has a small width of the spectral emission spectrum. In one configuration, it is embodied as a monomode laser. Moreover, it may be provided that the laser comprises a plurality of segments to which a current is applied independently of one another.

In a further configuration, cooling means are provided which have the effect that the laser and the nonlinear optical medium can be cooled independently of one another, such that a thermal decoupling is substantially present. This may be of importance for tuning the wavelength of the laser or of the nonlinear optical medium.

BRIEF DESCRIPTION OF THE DRAWINGS

The invention is explained in more detail below on the basis of a plurality of exemplary embodiments with reference to the FIGs., in which:

FIG. 11 shows a modification of the laser from FIG. 7, wherein the laser is embodied as a DFB laser having a grating in the straight waveguide section;

FIG. 12 shows a modification of the laser from FIG. 11, wherein the grating extends only in a partial region of the straight waveguide section;

FIG. 13 schematically shows a one-segment DFB laser in accordance with the prior art;

FIG. 14 schematically shows a three-segment DFB laser in accordance with the prior art;

FIG. 15 shows a three-segment DFB laser in which the last segment has a waveguide running obliquely adjacent to the facet of the segment, FIG. 16 schematically shows the coupling-out of light reflected at the exit facet from the waveguide if the waveguide runs at an angle with respect to the perpendicular to the exit facet adjacent to the exit facet of the laser;

DETAILED DESCRIPTION

Figure 1:
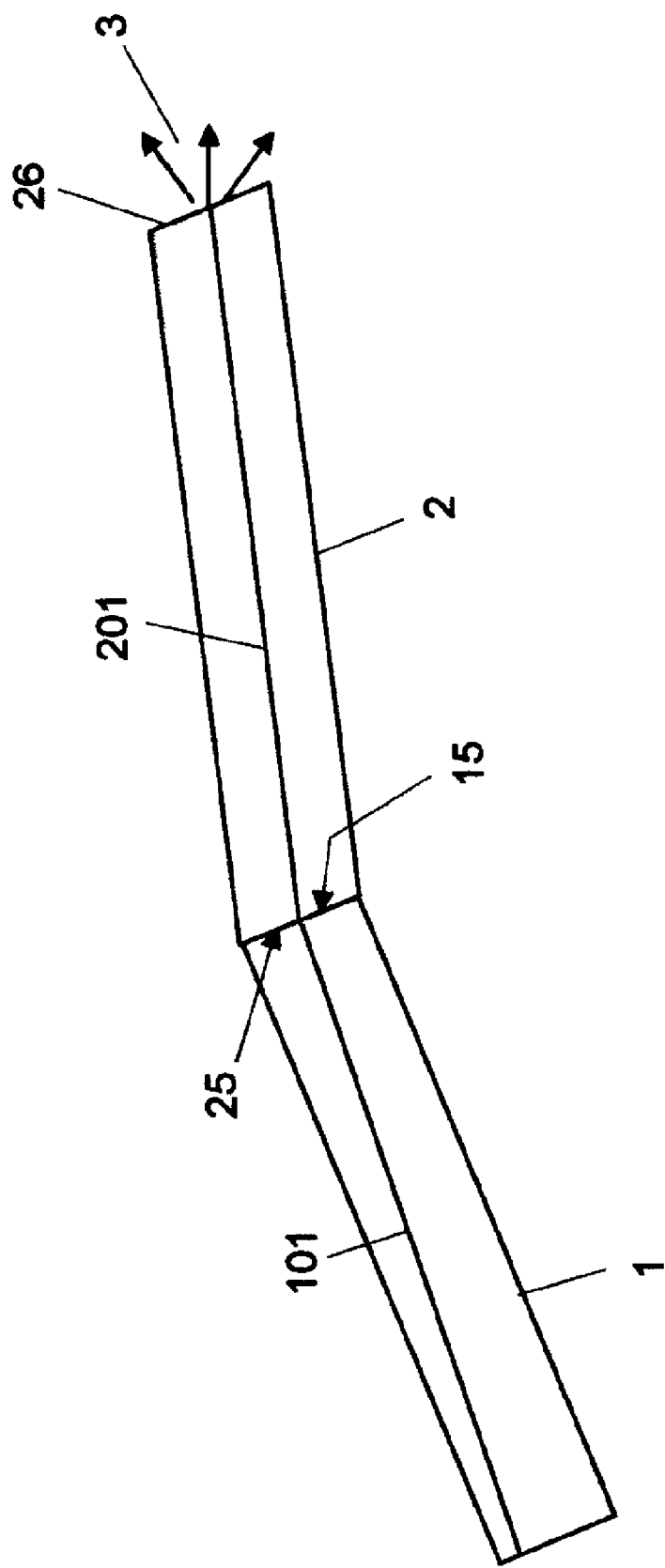
FIG. 1 shows schematically and in plan view a first exemplary embodiment of a frequency changing device comprising a laser and a crystal coupled to the laser, wherein a butt coupling is realized between the facets of the laser and of the crystal which run parallel and which are adjacent to one another.

FIG. 1 shows schematically and in plan view a frequency doubling device comprising a laser 1 and a crystal 2. The laser 1 emits for example light in the infrared spectral range, e.g. having a wavelength of 1060 nm. The laser light experiences frequency doubling (SHG—Second Harmonic Generation) in the crystal 2 and correspondingly converts the infrared light into e.g. green light. However, the frequency ranges mentioned should be understood merely by way of example.

The laser 1 is a semiconductor laser embodied as an edge emitter with an integrated waveguide 101 in the exemplary embodiment under consideration. For realizing the waveguide 101, the laser 1 has for example a weakly index-guided laser structure in the form of a ridge waveguide. In this case, the waveguide 101 is embodied rectangularly or alternatively trapezoidally in its cross-section. The wave propagation is restricted in both transverse directions. The configuration of the waveguide as a ridge waveguide will also be discussed in detail with reference to FIGS. 3 and 4. As an alternative, the laser 1 can also have a different weakly index-guided laser structure, be embodied with strongly index-guided laser structures such as buried laser structures or be embodied as a gain-guided laser.

The crystal 2 represents, by way of example, a nonlinear optical material which performs frequency doubling upon irradiation with light. A poled polymer or liquid crystals can also be used, for example, instead of a crystal. The following description of the invention refers to a crystal as nonlinear optical material, though the explanations are correspondingly applicable to other nonlinear optical materials.

The crystal 2 is for example a periodically poled $LiNbO_3$ crystal (PPLN), having an integrated waveguide 201, which can likewise be embodied as a ridge-like waveguide. Such crystals and the production thereof are described for example in K. Mizuuchi: Efficient 340-nm Light Generation by a Ridge-Type Waveguide in a First-Order Periodically Poled $MgO:LiNbO_3$, Optics Letters, Vol. 28, No. 15, Aug. 1, 2003.

They are commercially available for example from HC Photonics, Hsinchu 300, Taiwan, cf. www.hcphotonics.com/waveguide.htm.

Figure 2:
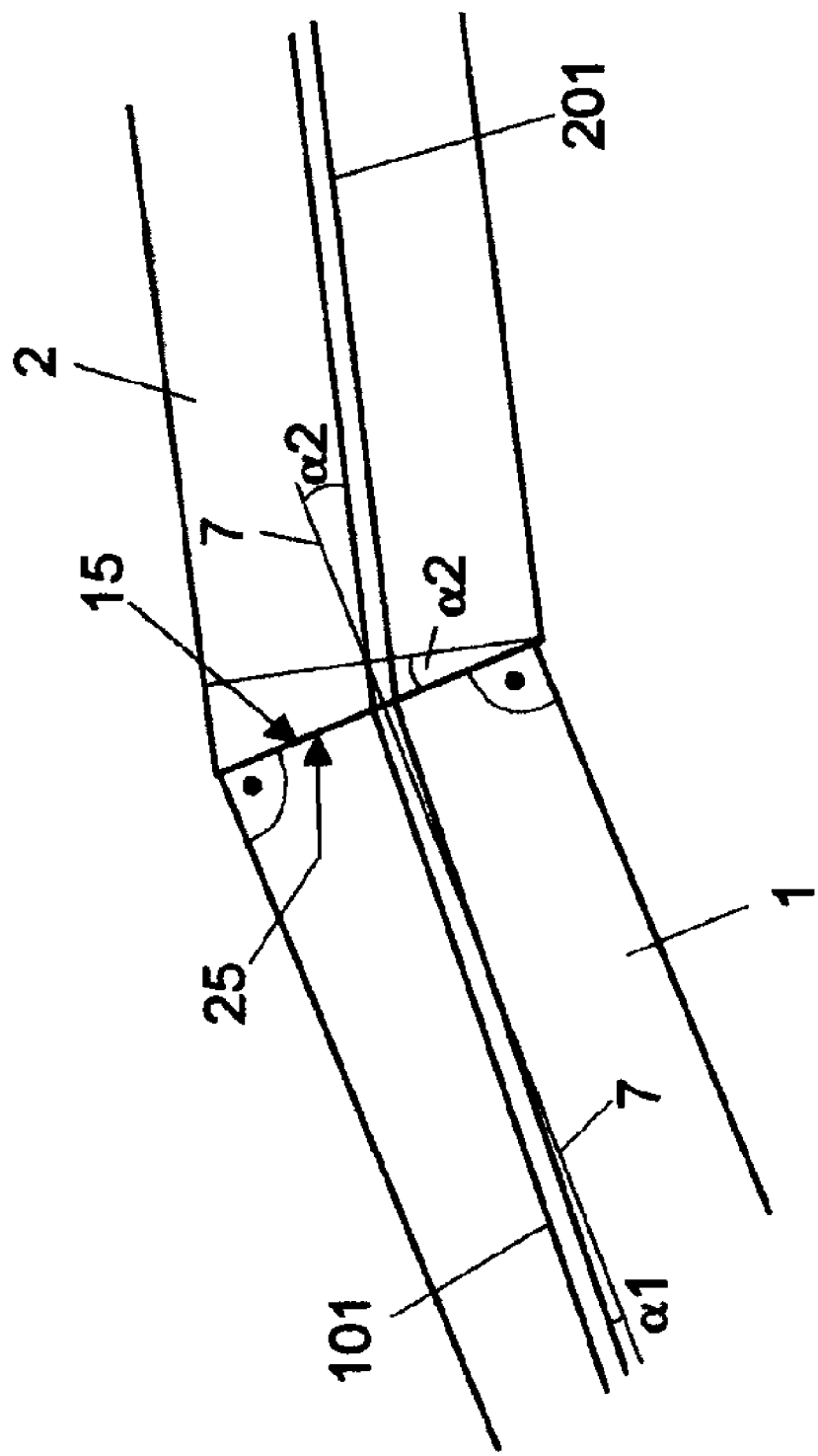
FIG. 2 shows an enlarged illustration of the device from FIG. 1 in the region of the facets of the laser and of the crystal which are arranged parallel to one another.

As can be gathered in particular from the enlarged illustration of the device in FIG. 2, the laser 1 has an exit facet 15, from which the light emerges from the laser. The exit facet 15 is not beveled relative to the laser body, that is to say that the angle between the longitudinal sides of the laser 1 and the exit facet 15 is a right angle. The waveguide 101 runs obliquely with respect to the perpendicular 7 to the exit facet 15, that is to say that it forms an angle $\alpha_{laser}$ with the perpendicular 7 to the exit facet 15. The angle $\alpha_{laser}$ is the angle between the propagation direction of the light in the laser (predetermined by the waveguide 101) and the perpendicular 7 to the exit facet 15. The angle $\alpha_{laser}$ is designated as $\alpha_1$ in FIG. 2.

The crystal 2 has an entrance facet 25 and an exit facet 26, which are beveled with the same angle or alternatively with a different angle, cf. FIG. 2. The light, in one embodiment, is guided as a single transverse mode inside the waveguide 201 of the crystal 2 avoiding a spread of the light intensity and thus keeping a large local intensity which is advantageous to achieve high conversion efficiency. The frequency-doubled light leaves the crystal 2 as a radiation field 3. In one configuration, the light passes through the crystal 2 only once (single pass).

The waveguide 201 of the crystal 2 is formed parallel to the longitudinal edges thereof in said crystal. On account of the inclination of the facet 25, the light emerging from the waveguide 101 of the laser 1 is refracted in the direction of the waveguide 201 and coupled into the waveguide 201 of the crystal. The condition of Snell's law holds true, according to which $$n_{laser}\sin(\alpha_{laser})=n_{crystal}\sin(\alpha_{crystal})$$

wherein $\alpha_{laser}$ and $\alpha_{crystal}$ are designated as $\alpha_1$ and $\alpha_2$ for the sake of simplicity. The designations have the following meanings:

$n_{laser}$ designates the refractive index of the light-guiding region (predetermined by the waveguide 101) of the laser 1, $n_{crystal}$ designates the refractive index of the light-guiding region of the crystal 2, $\alpha_1$ designates the angle between the propagation direction of the light in the laser (predetermined by the waveguide 101) and the perpendicular 7 to the exit facet 15 of the laser 1, and $\alpha_2$ designates the angle between the propagation direction of the light in the crystal (predetermined by the waveguide 201 of the crystal) and the perpendicular 7 to the entrance facet 25 of the crystal 2.

In this case, the perpendicular to the exit facet 15 of the laser 1 is identical to the perpendicular 7 to the entrance facet 25 of the crystal 2 since the two facets are arranged parallel to one another.

It is furthermore pointed out that the angle $\alpha_2$ also indicates the inclination of the facet 25 of the crystal 2, as illustrated in FIG. 2. The inclination of the facet 25 therefore predetermines the angle $\alpha_2$.

The condition of Snell's law defines a specific, precisely matching laser angle $\alpha_1$ for each crystal angle $\alpha_2$. For example, the crystal angle $\alpha_2$ is larger than 5° and smaller than 25°. Below 5° the desired benefit of reduced reflection is too week, and above 25° total internal reflection occurs.

As already mentioned, the facet 15 of the laser 1 and the facet 25 of the crystal 2 run parallel to one another and are situated in a butt coupling, that is to say that they are immediately and directly adjacent to one another. The exit facet 15 of the laser 1 and the entrance facet 25 of the crystal 2 are oriented in such a way that the condition of Snell's law is met. By account of their parallelism, the two facets 15, 25 can be nestled as closely to one another as desired.

In contrast to a conventional straight butt coupling, the angled butt coupling illustrated in FIGS. 1 and 2 prevents back-reflections by virtue of the fact that the waveguide 101 of the laser 1 is embodied at an angle relative to the exit facet 15 of the laser. This is illustrated schematically in FIG. 16: the light component which is reflected at the exit facet 15 is coupled out from the waveguide 101 for the most part and forms greatly reduced back-reflections. Self-oscillations are thereby reduced. Moreover, the spectral behavior of the laser is stabler since it is not influenced by reflected light from the exit region 102 of the waveguide 101. In this case, the exit region 102 of the waveguide 101, from which the laser light emerges, is a part of the exit facet 15 of the laser 1.

The refractive index of the semiconductor laser 1 is usually relatively high and has a value of 3.5, for example. The refractive index of the crystal 2 usually has a value of 2.2, such that the light entering into the crystal 2 is refracted away from the perpendicular 7.

In order to achieve an effective conversion, the spectral width of the emission spectrum of the laser 1 is chosen to be smaller than the spectral width of the acceptance window of the crystal 2. In particular, in one embodiment, the wavelength of the semiconductor laser 1 is very precise in order to match the narrow acceptance window of the crystal 2. Semiconductor lasers having an integrated grating in their structure meet this requirement. In an embodiment, this grating is formed along the complete length of the laser or along a segment of the laser shaping a distributed feedback (DFB) laser.

In one configuration, the laser 1 is a single-mode laser. The laser, for example, is a distributed feedback laser (DFB), in which a grating is arranged along the waveguide. In case of a DFB laser, the grating can lie in or over the active zone.

Due to the distributed feedback, laser 1 does not require any additional feedback such as the feedback from the exit facet 15.

It is furthermore noted that the laser can be a single-segment laser or a multisegment laser, as will also be explained with reference to FIGS. 13 to 15.

The solution described provides a laser-crystal coupling in a simple manner since it dispenses with lenses or lens systems for light coupling. At the same time it has a high coupling efficiency comparable with the coupling efficiency of a straight butt coupling. At the same time, back-reflections are reduced, thereby avoiding the disadvantages of a straight butt coupling.

Figure 3:
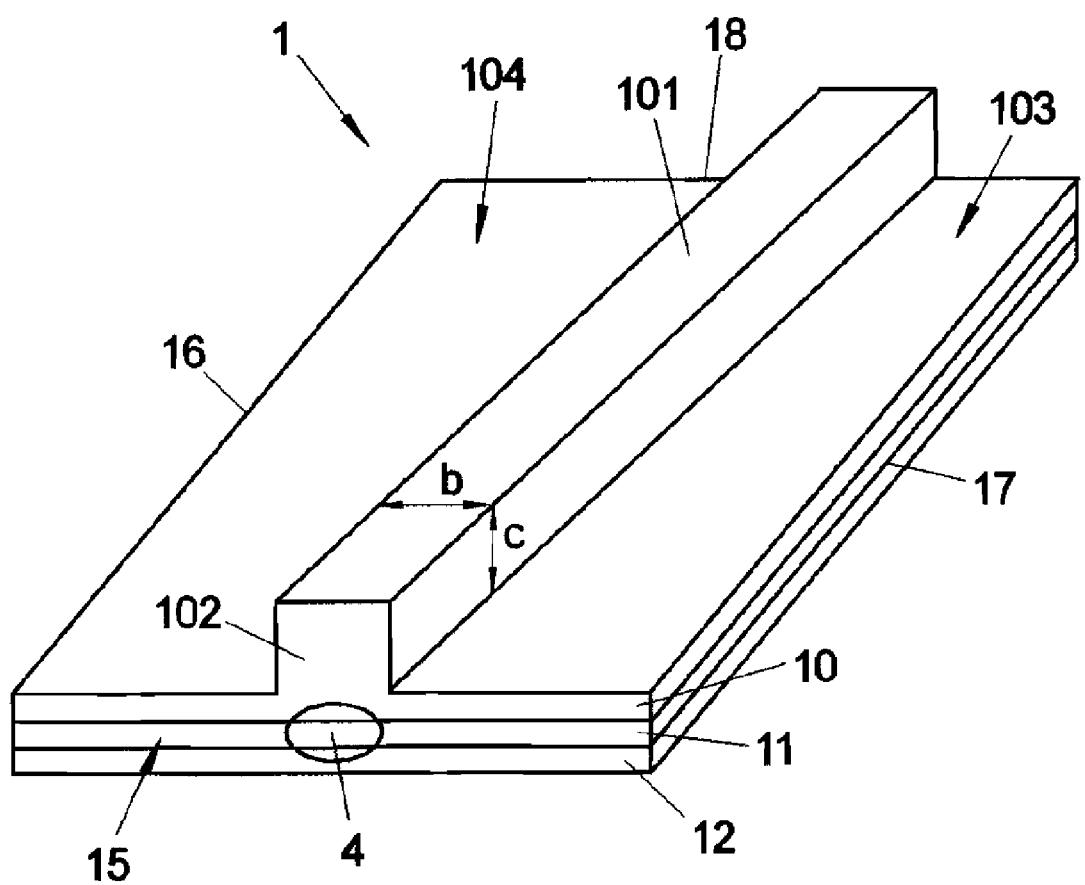
FIG. 3 shows schematically and in perspective view epitaxial layers of a ridge waveguide laser representing an exemplary configuration of the laser from FIGS. 1 and 2.

FIG. 3 shows one possible form of realization of a laser 1 that realizes a waveguide 101 running obliquely with respect to the exit facet 15. The exemplary embodiment illustrated involves a ridge waveguide laser 1 having a substrate with a plurality of epitaxial layers arranged thereon, wherein the topmost epitaxial layers have been patterned to form a ridge region 101. Since such ridge waveguide lasers are known per se to the person skilled in the art, their construction will be discussed only briefly. What is important in the present context is the oblique arrangement of the ridge region 101 relative to the exit facet 15. In this case, the ridge region 101 is oriented at an angle $\alpha_1$ with respect to the normal to the exit facet 15, in a manner corresponding to FIG. 2.

In detail, FIG. 3 schematically shows lower layers 12 of the laser structure, an active zone 11 and upper layers 10, which have been patterned to form the ridge region 101 and side regions 103, 104 arranged laterally with respect thereto. The ridge region 101 is rectangular in section and has a width b and a height c with respect to the side regions 103, 104. As an alternative, it can also be embodied in trapezoidal fashion. The width b and height c of the ridge region are for example 2.5 μm in each case. An elliptical radiation field or an elliptical light spot 4 forms in the active zone 11 below the ridge region 101.

It is pointed out that the laser 1 has rectangular dimensions, that is to say that the exit facet 15 is formed at right angles with respect to the lateral edges 16 and 17 and parallel to the rear facet 18. The waveguide 101 runs at an angle with respect to this rectangular basic structure, but its end side 102 is integrated into the end side 15 of the laser 1 in plane fashion.

Figure 4:
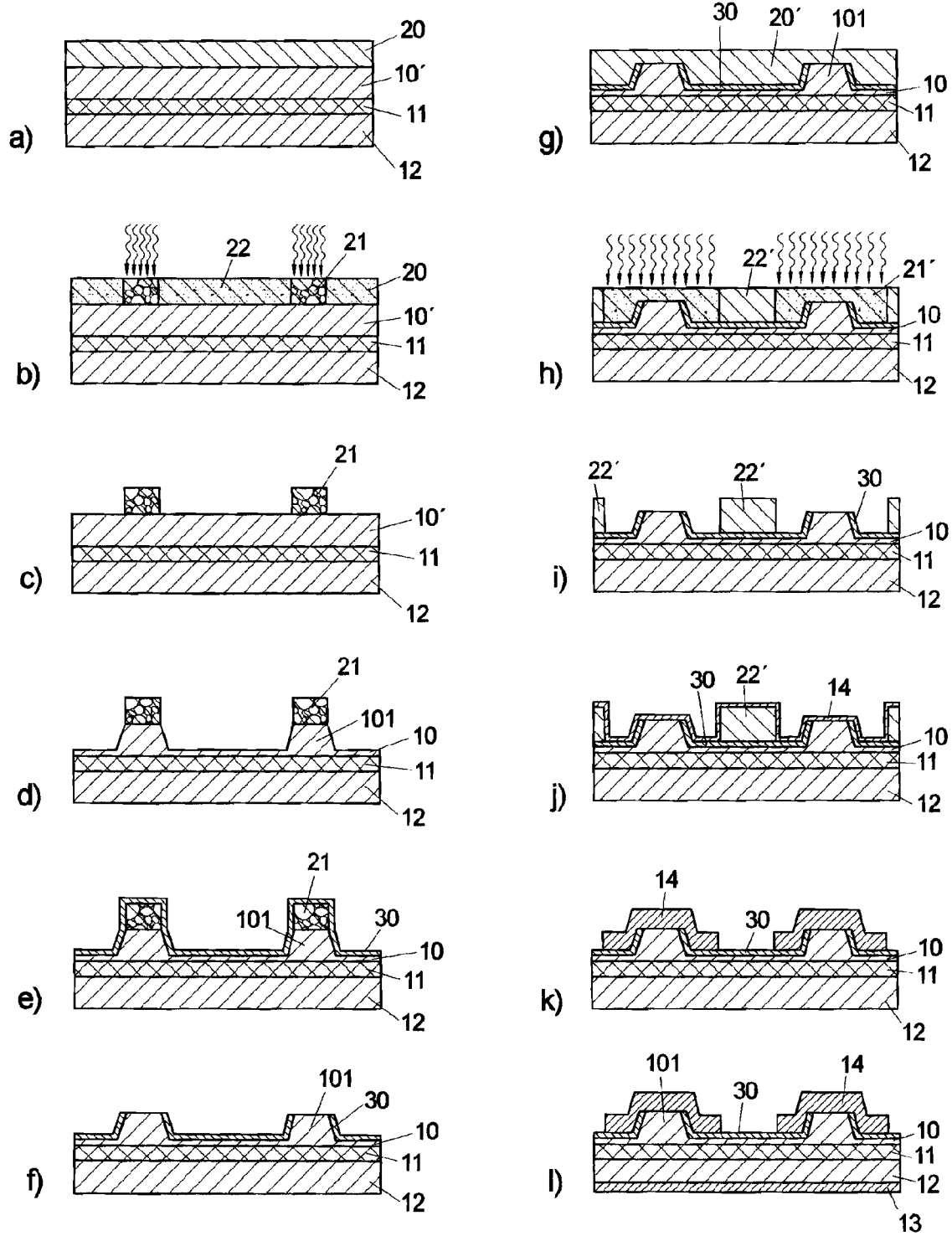
FIG. 4 shows method steps for producing a ridge waveguide laser in accordance with FIG. 3.

The production of a laser with an obliquely running waveguide is described by way of example with reference to FIG. 4 and method steps a) to l) illustrated therein.

In accordance with process step a), firstly a layer sequence comprising a lower layer 12, an active zone 11, an as yet unpatterned upper layer 10' and a photoresist 20 is provided. In step b), the photoresist 20 is exposed in accordance with the pattern of a mask, wherein exposed regions 21 and unexposed regions 22 arise in the photoresist 20. In this case, the mask is formed in such a way that the exposed regions 21 are formed obliquely with respect to the rectangular outer dimensions of the regions respectively under consideration which form the later laser chips.

After the exposure, the unexposed photoresist is removed, wherein ridges 21 composed of photoresist remain, step c). In a subsequent etching step, the ridge regions 101 are formed, step d). An insulating layer 30, for example composed of SiO$_2$, is subsequently applied, step e). The photoresist residues 21 are subsequently removed, giving rise to the structure illustrated in step f). Further application of photoresist 20' and the patterning thereof into exposed regions 21' and unexposed regions 22' are effected, cf. process steps g) and h). This serves to prepare for the application of a contact layer. In contrast to step c), the exposed regions 21' of the photoresist 20' are then removed and the unexposed regions 22' remain, step i). A contact layer 14 is then applied, which is composed for example of gold or a gold alloy, step j). After the contacts 14 have attained their desired thicknesses, the regions 22' of the photoresist are removed, step k). Finally, a contact 13 is also applied on the underside, step l).

The structure produced corresponds to the structure in FIG. 3, wherein contacts 13 on the underside and contacts 14 above the ridge regions 101 have additionally been drawn by comparison with the illustration in FIG. 3. An insulator 30 formed laterally with respect to the upper contact 14 is also illustrated.

The process steps and patterning of the layer 10' are effected on a wafer. The structures produced are subsequently singulated to give rise to individual laser chips. The individual laser chips are rectangular and have ridge regions 101 running obliquely with respect to the exit facet owing to the use of a suitable mask in step b).

Figure 5:
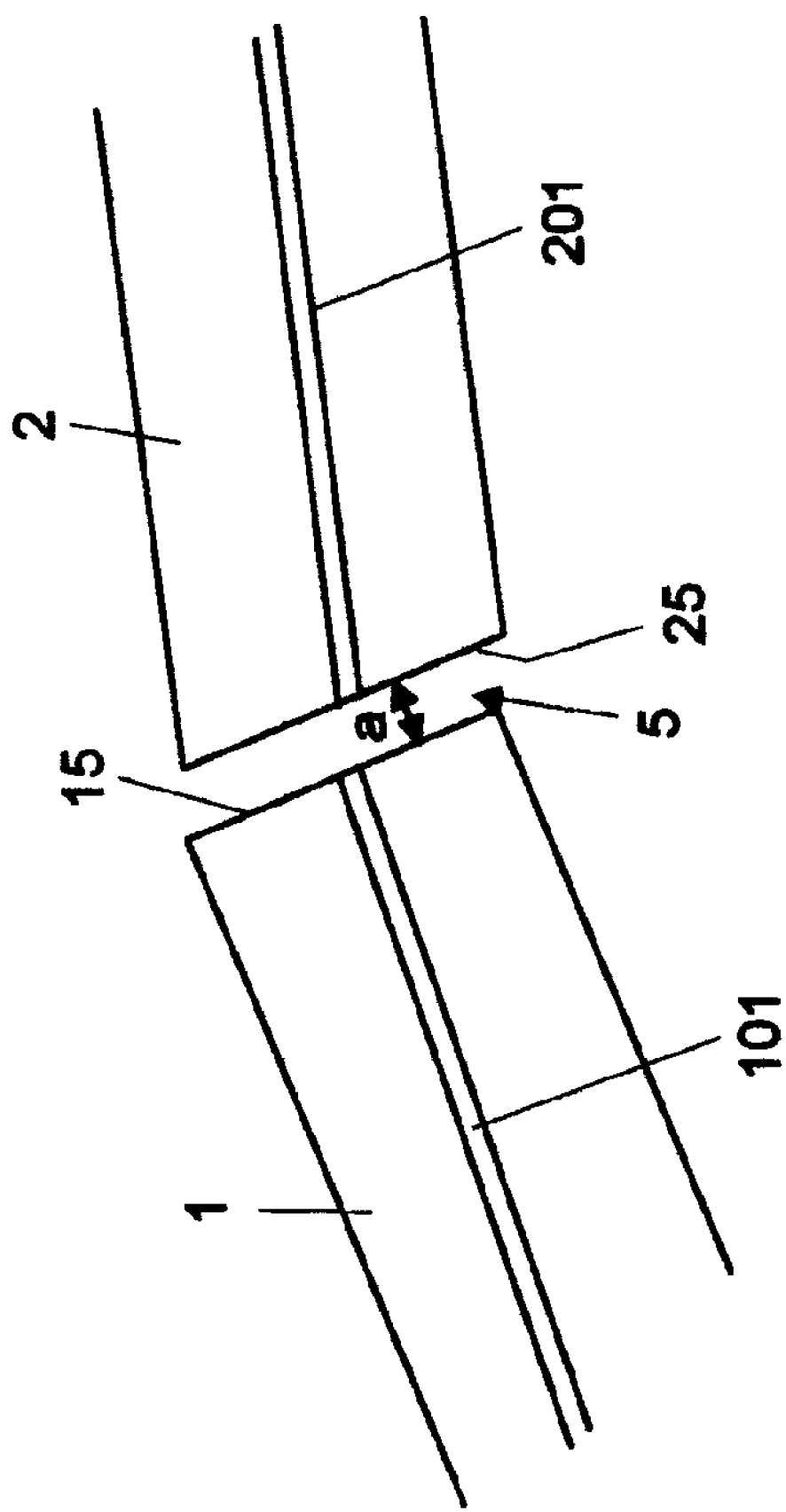
FIG. 5 shows an alternative configuration of a frequency changing device comprising a laser and a crystal, wherein the facets of the laser and of the crystal which are adjacent to one another and which run parallel realize a quasi-butt coupling with a small spacing, with in principle the same construction as in the device from FIGS. 1 and 2.

FIG. 5 shows an exemplary embodiment in which the facet 15 of the laser and the facet 25 of the crystal 2 are separated by an interspace 5 but still arranged parallel to one another. The distance a between the facets lies for example in the range of between 1 μm and 20 μm. This can be referred to as a quasi-butt coupling. The functioning is unchanged in relation to the configuration in FIGS. 1 and 2, such that reference is made to the explanations in respect thereof. The coupling efficiency is reduced somewhat on account of the spacing apart of the facets 15, 25.

Figure 6:
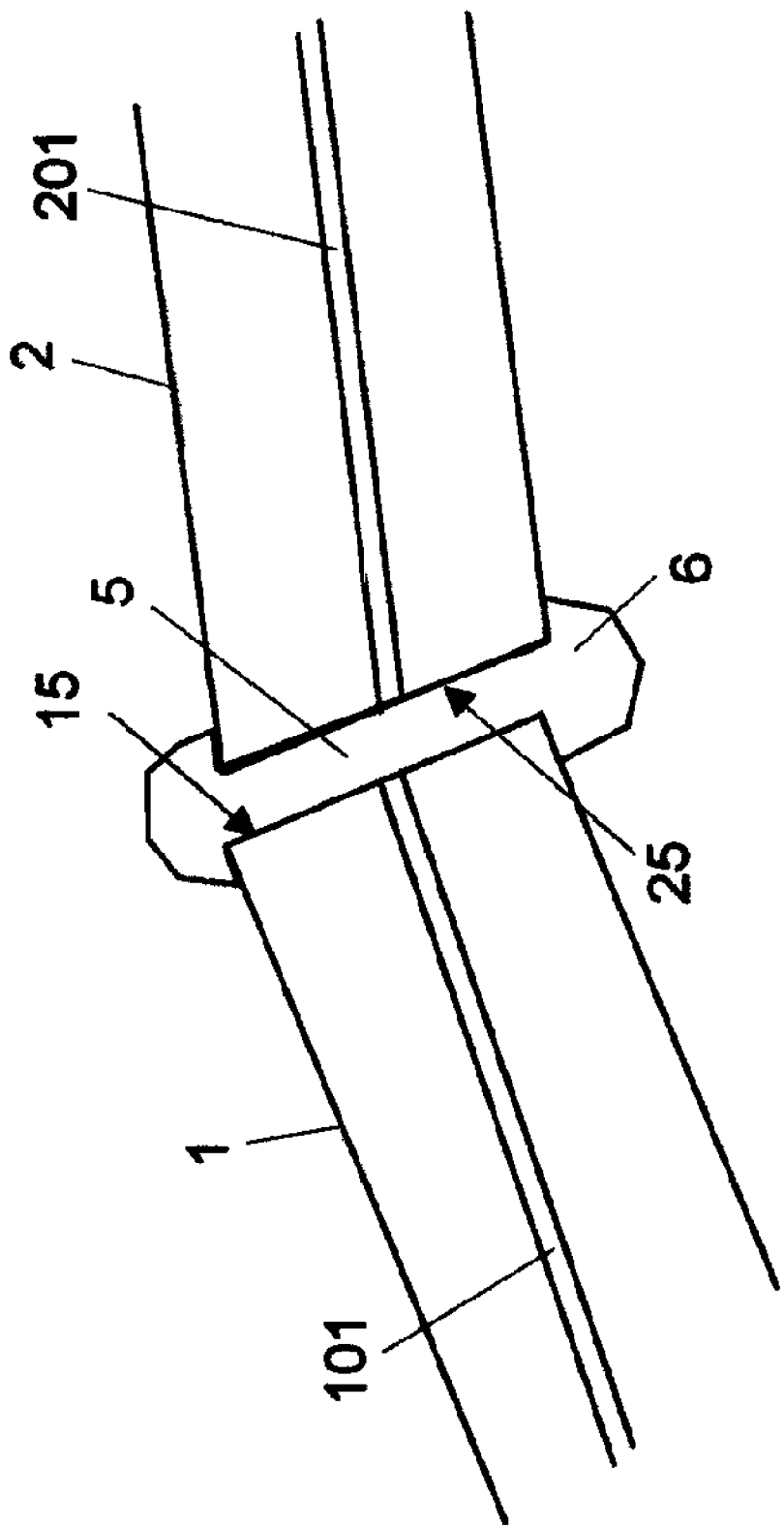
FIG. 6 shows a device in accordance with FIG. 5, wherein an index-matched substance is additionally provided between the facets of the laser and of the crystal.

In accordance with the configuration in FIG. 6, provision may be made for filling the interspace 5 between the two facets 15, 25 with an index-matched material 6. The coupling efficiency is thereby increased.

One advantage of the configuration in FIG. 5 and to a certain degree also in FIG. 6 is that the laser 1 and the crystal 2 are decoupled with regard to their temperature, such that they can be stabilized with regard to their temperature in a relatively simple manner by respectively separate cooling devices. Moreover, there is the advantage that, since the facets 15, 25 are not touching, the risk of destruction or damage of the facets is reduced.

In the previous exemplary embodiments, the waveguide 101 of the laser 1 was embodied in rectilinear fashion. However, this is not in any way necessarily the case as long as the waveguide runs at an angle with respect to the normal to the exit facet 15 adjacent to the exit facet 15. In the exemplary embodiment of FIG. 7, in this respect a laser 1' is provided, the waveguide of which has a straight waveguide section 110 adjoined by a waveguide section 111 running at an angle. A corresponding structure can be produced by providing a corresponding mask during the patterning. FIG. 8a shows a corresponding configuration for the case of a ridge waveguide laser. A transition region 112 is realized between the section 110 that runs straight and the obliquely running section 111, the obliquely running region 111 bending away in said transition region. In this case, it may be provided that said transition region 112 is formed in continuous fashion by a curvature. This is illustrated in FIG. 8b. The curvature can be present just in the transition region 112, such that the region 111 is inherently formed in rectilinear fashion. It may likewise be provided that the curvature continues into the region 111, that is to say that the latter is formed in curved fashion— in sections or completely.

In further exemplary embodiments, the waveguide 101, adjacent to the exit facet 25 too, is not formed in rectilinear fashion but rather runs in curved fashion.

Figure 9:
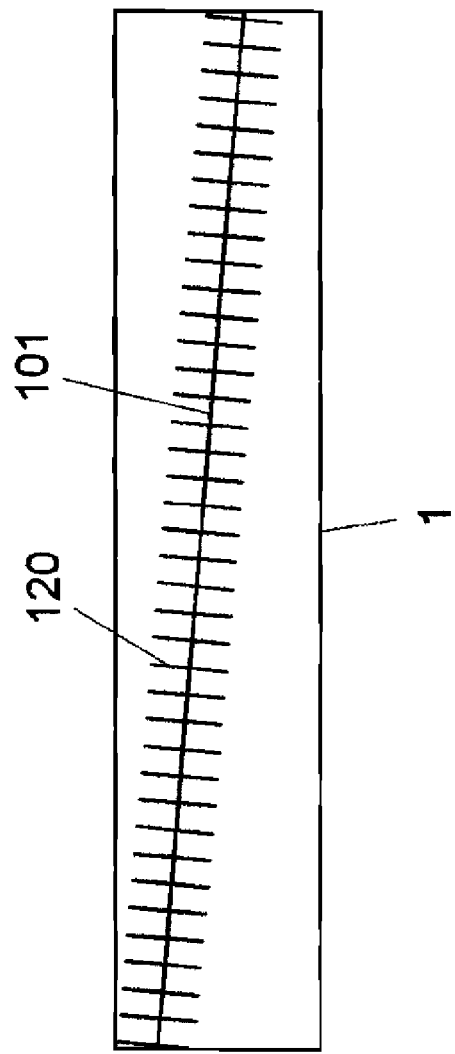
FIG. 9 shows an exemplary embodiment of a laser, suitable for use in a device in accordance with FIGS. 1 and 2, as a DFB laser with integrated grating which extends over the entire length of the waveguide.
Figure 10:
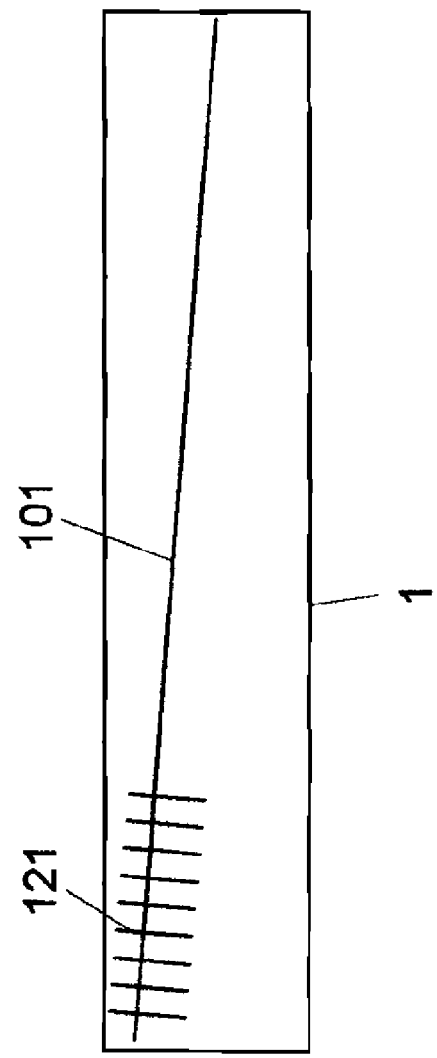
FIG. 10 shows a modification of the laser from FIG. 9, wherein the grating extends only over a partial region of the waveguide of the laser.

FIG. 9 shows schematically the embodiment of the laser 1 as a DFB laser with an obliquely running waveguide 101 and an integrated grating 120. Since DFB lasers with gratings are known per se, they will not be discussed any further here. In the configuration in FIG. 10, the grating 121 is shortened and extends only over a partial region of the waveguide 101. The angles shown in FIGS. 9 and 10 are schematic only.

Figure 7:
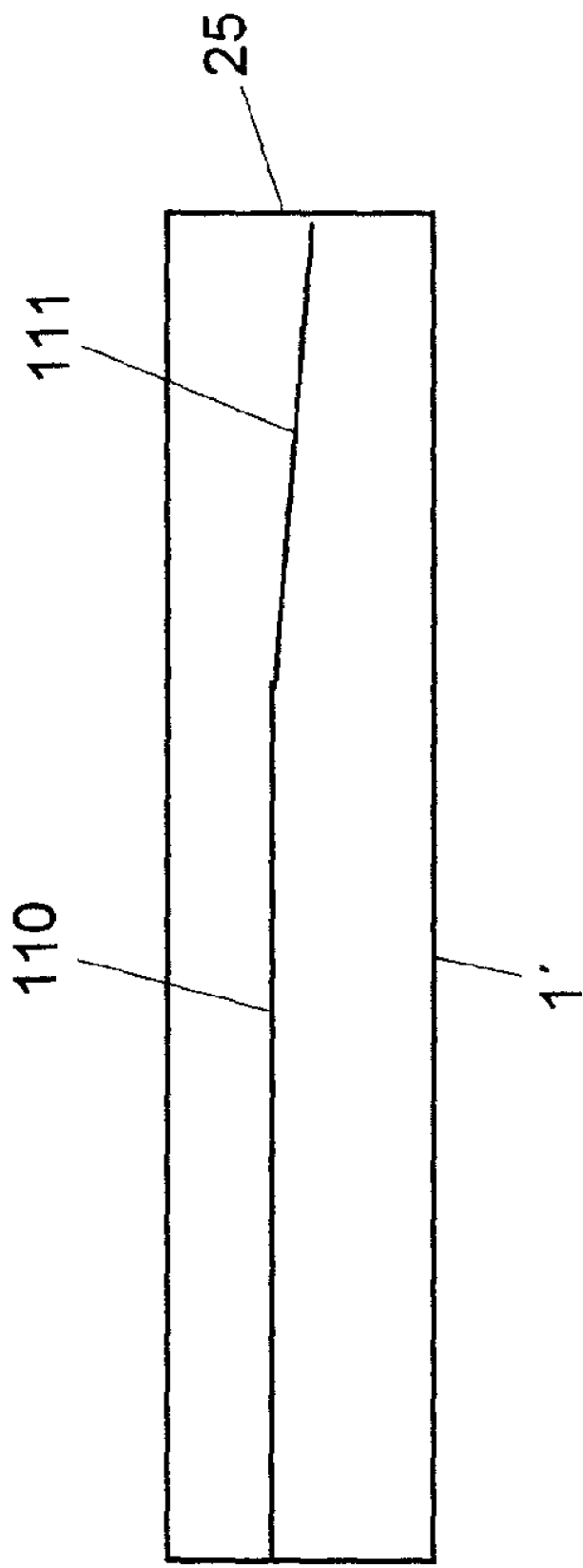
FIG. 7 shows schematically and in plan view an alternative configuration of a laser, suitable for use in a device in accordance with FIGS. 1 and 2, wherein the waveguide of the laser realizes a straight section and a section running at an angle.
Figure 8A:
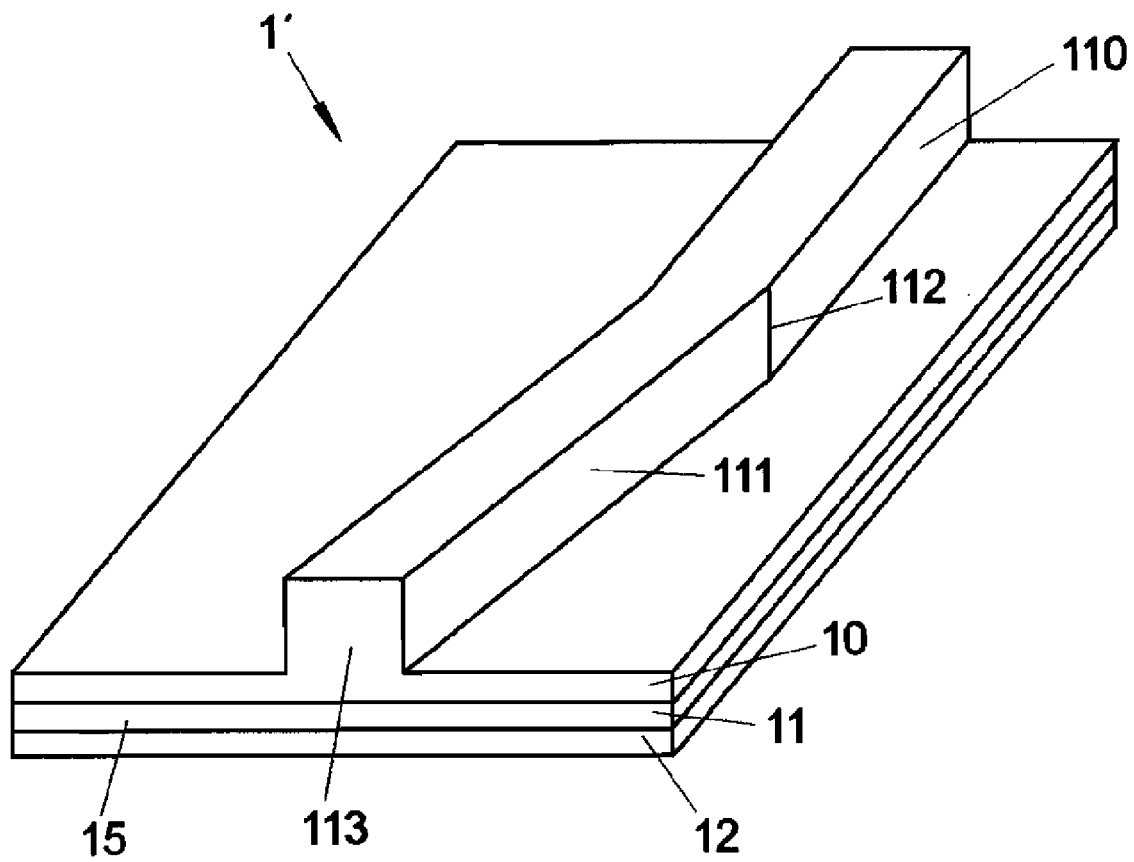
FIG. 8a shows a schematic illustration of a ridge waveguide laser representing an exemplary realization of the laser from FIG. 7.
Figure 8B:
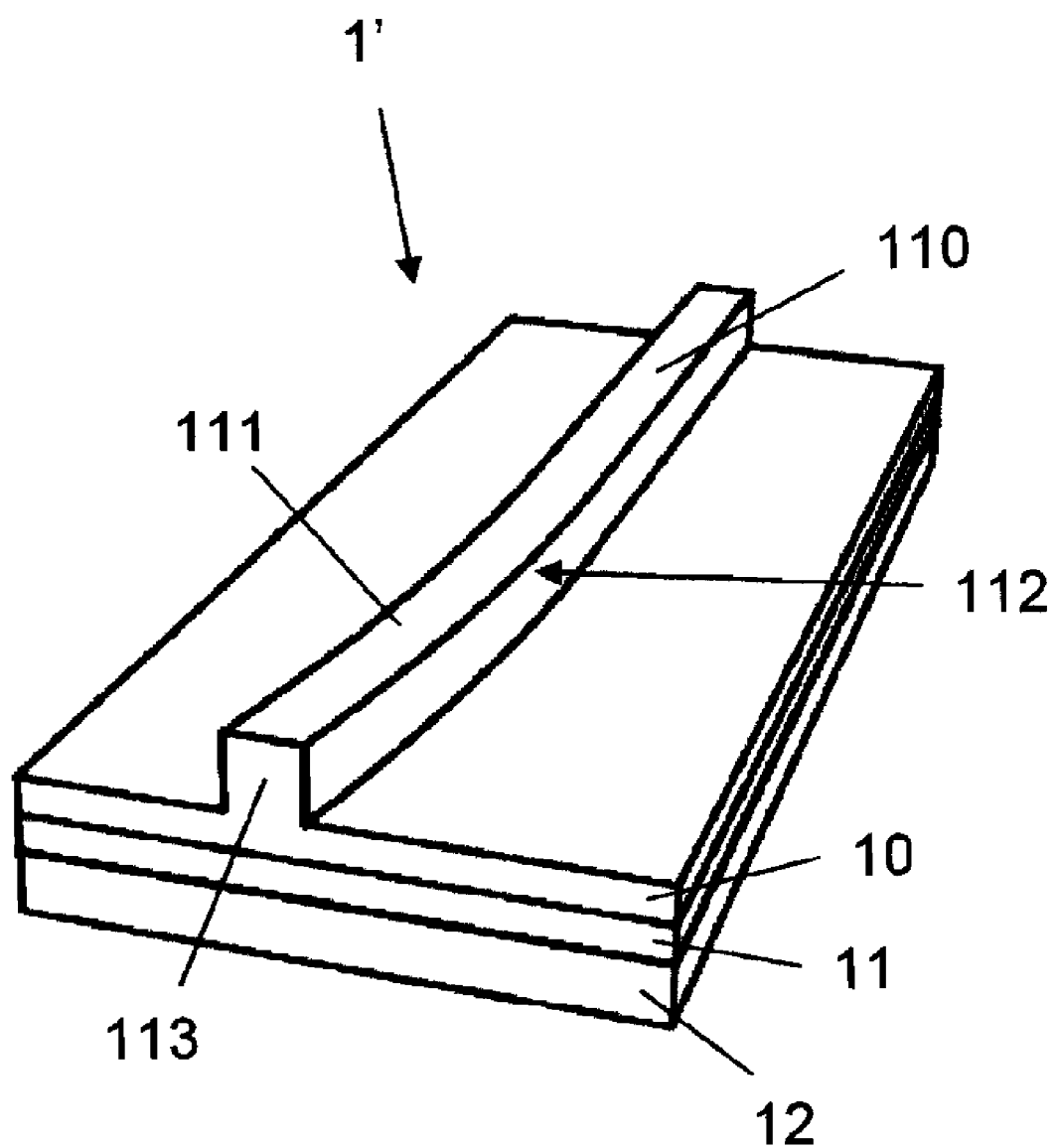
FIG. 8b shows a schematic illustration of a further ridge waveguide laser, wherein the transition region between two sections of the laser is embodied in curved fashion.

FIG. 11 shows the integration of a grating 120 in a laser 1' having a waveguide 110, 111 in accordance with FIGS. 7, 8a and 8b. The Bragg grating can extend over the entire straight waveguide section 110 (FIG. 11) or only over a partial region of said section 110 (FIG. 12).

The present invention can be realized with lasers embodied as single-segment lasers or as multisegment lasers. In accordance with FIG. 13, the laser 1 is embodied as a single-segment DFB laser. In accordance with FIG. 14, the laser 1 is embodied as a three-segment DFB laser having a region 1a with a grating, a spacer 1b and a power amplifier 1c. Lasers of this type are described, for example, in Brian R. Koch et al.: Monolithic Mode-Lockel Laser and Optical Amplifier for Regenerative Pulsed Optical Clock Recovery, IEEE Photonics Technology Letters, Vol. 19, No. 9, May 1, 2007.

FIG. 15 shows an embodiment of the invention in which the laser 1 is embodied as a three-segment DFB laser. A first segment 1a forms the DFB-laser and includes a grating. A second segment 1b represents a spacer. A third segment 1c forms a power amplifier. The three segments 1a, 1b, 1c are driven separately. In the embodiment of FIG. 15, both the spacer 1b and the power amplifier 1c are monolithically integrated into the laser 1. This allows the light source to be compact and small sized.

In the third region 1c forming the power amplifier there is provided an obliquely running or curved region 111 of the waveguide 110. The obliquely running or curved region 111 is adjacent to the exit area 15 of the laser 1. The emerging light is emitted as light cone 4.

The waveguide 110 is a continous structure extending through sections 1a, 1b and 1c as shown in FIG. 15. The waveguide 110 may be a ridge waveguide having a ridge region as discussed with respect to FIGS. 3, 8a and 8b.

The laser resonator is formed in the DFB section 1a only, i.e., the light oscillates inside the DFB section 1a only. A single-frequency operation can be obtained with an emission wavelength that is well defined in the DFB section.

The spacer section 1b is inserted between the DFB section 1a and the power amplifier section 1c. A current injected into the spacer section 1b can be used to precisely adjust the optical output power to amplifier current relationship. The spacer section 1b also reduces the heat flow from the amplifier section 1c towards the DFB section 1a when the amplifier is operated under large currents.

The reflectivity R at the emission facet 15 of segment 1c is very small. In one embodiment, the reflectivity R is less than 0.1% and ideally is zero. To achieve a small reflectivity R, the angle $\alpha_1$ between the propagation direction of the light in the laser (predetermined by the waveguide 101) and the perpendicular to the exit facet 15 of the laser 1 (see FIG. 2) in one embodiment lies in the range between 3° and 16°. A very small reflectivity R ensures a stable wavelength operation, as any reflection from the emission facet 15 could lead to a feedback which disturbs the laser.

In an embodiment, the exit facet 15 of the laser is coated with an antireflective material (AR-coated) to further decrease the reflectivity, e.g., from $10^{-3}$ to $10^{-5}$. Also, both facets of the crystals in one embodiment are AR-coated, i.e., for 1060 nm and 530 nm, respectively, in case infrared light is converted into green light.

Figure 17:
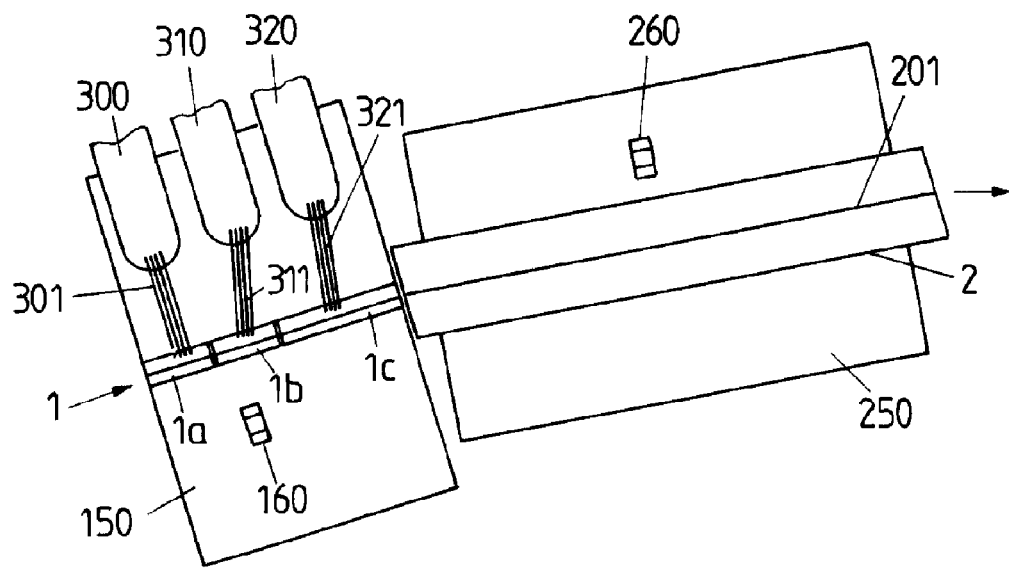
FIG. 17 an embodiment of a frequency changing device comprising a three-segment DFB laser and a crystal coupled to the laser.

FIG. 17 shows an embodiment of a frequency changing device with a three-segment DFB laser 1 according to FIG. 15 and a crystal 2 coupled to the three-segment laser 1. The laser 1 shows a DFB segment 1a, a spacer segment 1b and an amplifier segment 1c as discussed with respect to FIG. 15. There are provided HF connections 300, 310, 320 which connect through bond wires 301, 311, 321 to the respective sections 1a, 1b, 1c of the laser 1. The laser is soldered on a structured AlN (Aluminum Nitride) submount 150.

The crystal 2 (i.e., a PPLN crystal) has an integrated waveguide 201 and is butt coupled to the laser 1. The crystal 2 is glued on a Si (Silicon) carrier 250 with its waveguide 201 facing down. This design allows for a close approach of the crystal 2 to the laser 1. In order to avoid glue on the facets of the crystal 2, the length of the Si carrier 250 is made slightly shorter than the crystal 2. The alignment of the crystal 2 gluing process is done actively while the laser 1 is operating, by measuring and maximizing the optical output power.

Further, a thermistor 160, 260 may be provided both on the AlN submount 150 and the Si carrier 250 for measuring the temperature of the laser 1 and the crystal 2, respectively. Also, both the AlN submount 150 and the Si carrier 250 or at least one of them may be situated on a thermoelectric cooler (TEC) element (not shown) such that the temperature of the AlN submount 150 with the laser 1 and of the Si carrier 250 with the crystal 2 may be adjusted independently. Such different temperature may be used to adjust a wavelength match between the emission wavelength of the laser 1 and the conversion wavelength of the crystal 2.

Figure 18:
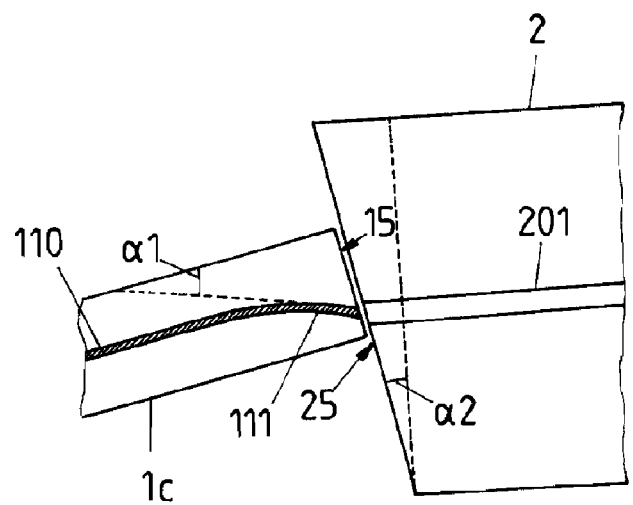
FIG. 18 an enlarged top view of the intersection between the laser and the crystal of the embodiment of FIG. 17.

FIG. 18 is an enlarged top view of the intersection between the laser 1, namely the power amplifier section 1c of the laser 1 and the crystal 2. The waveguide 110 is curved and has a bent portion 111 adjacent to the exit area 15 of the laser. The angles $\alpha 1$, $\alpha 2$ are similar to those described with respect to FIG. 2.

The laser 1 may have a total length of 4 mm with the DFB section 1a, the spacer section 1b and the amplifier section 1c having a length of 1 mm, 1 mm and 2 mm, respectively. The crystal 2 coupled to the laser may have a length of 8.5 mm. Altogether, the light source in such embodiment has a length of 13 mm, a width of 6 mm and a height of 2 mm. At a wavelength of 530 nm, a green optical output power of more than 35 mW may be achieved for injection currents of 93 mA and 400 mA through the DFB section and amplifier section, respectively.

The polarization of the electrical field vector for the laser 1 and the crystal 2, in one embodiment, is in the horizontal direction, parallel to the base surface.

The invention is not restricted in its configuration to the exemplary embodiments illustrated above, which should be understood merely by way of example. Other types of lasers, other embodiments of waveguides, other nonlinear optical materials or the use of other wavelengths can be provided, for example.

The invention claimed is:
1. A frequency changing device, comprising:
a laser which generates light having a specific frequency and which comprises a waveguide in which the light is guided in the laser; and
a nonlinear optical medium which changes the frequency of the light generated by the laser, wherein:
the laser has an exit facet facing the nonlinear optical medium, from which exit facet the light emerges from the laser,
the nonlinear optical medium has an entrance facet facing the laser, through which entrance facet the laser light enters into the nonlinear optical medium,
the nonlinear optical medium has at least one exit facet through which the frequency-changed laser light emerges from the nonlinear optical medium,
the waveguide of the laser at least adjacent to the exit facet of the laser runs at an angle with respect to the perpendicular to the exit facet,
the exit facet of the laser and the entrance facet of the nonlinear optical medium are arranged parallel to one another,
the laser is a distributed feedback (DFB) laser comprising a grating which is formed along at least a segment of the laser,
the non-linear optical medium comprises a wave guide in which the light is guided in the nonlinear optical medium, wherein the nonlinear optical medium comprises outer edges and wherein the nonlinear optical medium is embodied parallel to the outer edges of the nonlinear optical medium,
the entrance facet of the nonlinear optical medium runs beveled at an angle different than 90° with respect to the outer edges of the nonlinear optical medium, and
the exit facet of the laser and the entrance facet of the nonlinear optical medium are oriented with respect to one another in such a way that the condition of Snell's law is met; i.e.

$$n_{laser}\sin(\alpha_{laser}) = n_{nonlinear\ optical\ medium}\sin(\alpha_{nonlinear\ optical\ medium})$$

where:
- $n_{laser}$ represents the refractive index of the light-guiding region of the laser,
- $n_{nonlinear\ optical\ medium}$ represents the refractive index of the light-guiding region of the nonlinear optical medium,
- $\alpha_{laser}$ represents the angle between the waveguide of the laser and the perpendicular to the exit facet of the laser, and
- $\alpha_{nonlinear\ optical\ medium}$ represents the angle between the propagation direction of the light in the nonlinear optical medium and the perpendicular to the entrance facet of the nonlinear optical medium.

2. The device as claimed in claim 1, wherein at least the entrance facet of the nonlinear optical medium is beveled relative to the propagation direction of the light in the nonlinear optical medium.

3. The device as claimed in claim 1, wherein the exit facet of the laser and the entrance facet of the nonlinear optical medium touch directly against one another.

4. The device as claimed in claim 1, wherein the exit facet of the laser and the entrance facet of the nonlinear optical medium run parallel and are at a distance from one another which is less than 20 μm or less than 10 μm.

5. The device as claimed in claim 4, wherein the interspace between the exit facet of the laser and the entrance facet of the nonlinear optical medium is filled with an index-matched substance.

6. The device as claimed in claim 1, wherein the laser is embodied as an index-guided laser or gain-guided laser.

7. The device as claimed in claim 1, wherein the waveguide of the laser is embodied rectangularly or trapezoidally in cross section.

8. The device as claimed in claim 1, wherein the waveguide of the laser is embodied as a ridge waveguide.

9. The device as claimed in claim 1, wherein the laser is embodied as a laser chip having a rectangular base area, one side area of which forms the light exit facet of the laser, and the waveguide, at least in a partial region, is embodied at an angle or in bent fashion with respect to the rectangular base structure of the laser diode.

10. The device as claimed in claim 1, wherein the waveguide of the laser is embodied at an angle with respect to the perpendicular to the exit facet of the laser over its entire length.

11. The device as claimed in claim 1, wherein the waveguide of the laser is embodied at an angle with respect to the perpendicular to the exit facet only in a region adjacent to the exit facet.

12. The device as claimed in claim 1, wherein the waveguide of the laser is embodied in rectilinear fashion or has regions embodied in rectilinear fashion in each case.

13. The device as claimed in claim 12, wherein the waveguide is continuously curved in the transition region between two regions embodied in rectilinear fashion.

14. The device as claimed in claim 1, wherein the waveguide of the laser is embodied in curved fashion at least adjacent to the exit area of the laser.

15. The device as claimed in claim 1, wherein the waveguide of the laser has a changed cross section adjacent to the exit area of the laser.

16. The device as claimed in claim 1, wherein the laser and the nonlinear optical medium are embodied in such a way that the spectral width of the emission spectrum of the laser is smaller than the spectral width of the acceptance window of the nonlinear optical medium.

17. The device as claimed in claim 1, wherein the laser is embodied as a single-mode laser.

18. The device as claimed in claim 1, wherein the laser comprises a plurality of segments.

19. The device as claimed in claim 18, wherein one of the segments forms a laser oscillator.

20. The device as claimed in claim 19, wherein another of the segments forms an optical power amplifier, amplifying light emitted by the laser oscillator, wherein the optical power amplifier section includes a portion of the waveguide that at least adjacent to the exit facet of the optical power amplifier section runs at an angle with respect to the perpendicular to the exit facet.

21. The device as claimed in claim 18, wherein the segments are configured such that current is applied to the segments independently of one another.

22. The device as claimed in claim 1, wherein the exit facet of the laser has a reflectivity that is less than 0.1%.

23. The device as claimed in claim 1, wherein the exit facet of the laser is coated with an antireflective material.

24. The device as claimed in claim 1, wherein cooling means are provided which have the effect that the laser and the nonlinear optical medium are cooled independently of one another.

25. The device as claimed in claim 1, wherein the nonlinear optical medium is formed by a crystal.

26. The device as claimed in claim 25, wherein the crystal is a periodically poled $LiNbO_3$ crystal having an integrated waveguide.

27. The device as claimed in claim 1, wherein the device is configured to generate green light.

28. A frequency changing device, comprising:
- a laser embodied as a laser chip having a rectangular base area, the laser generating light having a specific frequency and comprising a waveguide in which the light is guided in the laser; and
- a nonlinear optical medium comprising parallel, longitudinal outer edges, the nonlinear optical medium changing the frequency of the light generated by the laser and comprising a waveguide in which the light is guided in the nonlinear optical medium, the waveguide running parallel to the outer edges of the nonlinear optical medium, wherein:
  - the laser has an exit facet facing the nonlinear optical medium, from which exit facet the light emerges from the laser, the exit facet being formed by one side area of the laser chip rectangular base area,
  - the nonlinear optical medium has an entrance facet facing the laser, through which entrance facet the laser light enters into the nonlinear optical medium,
  - the nonlinear optical medium has at least one exit facet through which the frequency-changed laser light emerges from the nonlinear optical medium, and wherein
  - the waveguide of the laser at least adjacent to the exit facet of the laser runs at an angle with respect to the perpendicular to the exit facet,
  - the waveguide of the laser at least adjacent to the exit facet of the laser runs at an angle or in a bent fashion with respect to the rectangular base area in the laser,
  - the exit facet of the laser and the entrance facet of the nonlinear optical medium are arranged parallel to one another, and the exit facet of the laser and the entrance facet of the nonlinear optical medium are oriented with respect to one another in such a way that the condition of Snell's law is met:

$$n_{laser} \sin(\alpha_{laser}) = n_{nonlinear\ optical\ medium} \sin(\alpha_{nonlinear\ optical\ medium})$$

where:

$n_{laser}$ represents the refractive index of the light-guiding region of the laser, $n_{nonlinear\ optical\ medium}$ represents the refractive index of the light-guiding region of the nonlinear optical medium, $\alpha_{laser}$ represents the angle between the waveguide of the laser and the perpendicular to the exit facet of the laser, and $\alpha_{nonlinear\ optical\ medium}$ represents the angle between the propagation direction of the light in the nonlinear optical medium and the perpendicular to the entrance facet of the nonlinear optical medium.

* * * * *

UNITED STATES PATENT AND TRADEMARK OFFICE
CERTIFICATE OF CORRECTION

| | | |
|---|---|---|
| PATENT NO. | : 7,983,315 B2 | Page 1 of 1 |
| APPLICATION NO. | : 12/354156 | |
| DATED | : July 19, 2011 | |
| INVENTOR(S) | : Joerg Wiedmann et al. | |

It is certified that error appears in the above-identified patent and that said Letters Patent is hereby corrected as shown below:

Title Page,
Item (73), Assignee, change --Eagley Ard Photonics GmbH-- to --Eagleyard Photonics GmbH--

Signed and Sealed this
Eighteenth Day of October, 2011

David J. Kappos
*Director of the United States Patent and Trademark Office*